(12) United States Patent
Toyoda et al.

(10) Patent No.: US 6,897,143 B2
(45) Date of Patent: May 24, 2005

(54) METHOD OF MANUFACTURING SEMICONDUCTOR DEVICE INCLUDING TWO-STEP POLISHING OPERATION FOR CAP METAL

(75) Inventors: Hiroshi Toyoda, Yokohama (JP); Hiroyuki Yano, Yokohama (JP); Gaku Minamihaba, Kawasaki (JP); Dai Fukushima, Fujisawa (JP); Tetsuo Matsuda, Tano-gun (JP); Hisashi Kaneko, Fujisawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/600,568

(22) Filed: Jun. 23, 2003

(65) Prior Publication Data

US 2004/0005774 A1 Jan. 8, 2004

Related U.S. Application Data (62) Division of application No. 09/677,743, filed on Oct. 3, 2000, now Pat. No. 6,611,060.

(30) Foreign Application Priority Data

| Oct. 4, 1999 | (JP) | ............................................ 11-282404 |
| Oct. 4, 1999 | (JP) | ............................................ 11-282405 |

(51) Int. Cl.$^7$ ......................................... H01L 21/4763
(52) U.S. Cl. ....................................... 438/626; 438/637
(58) Field of Search ................................. 438/626, 637

(56) References Cited

U.S. PATENT DOCUMENTS 5,451,551 A * 9/1995 Krishnan et al. ........... 438/626

| 5,470,789 A | 11/1995 | Misawa |
| 5,578,523 A | 11/1996 | Fiordalice et al. |
| 5,877,076 A | 3/1999 | Dai |
| 5,880,018 A | 3/1999 | Boeck et al. |
| 5,985,748 A | 11/1999 | Watts et al. |
| 6,297,557 B1 * | 10/2001 | Bothra ....................... 257/767 |
| 6,433,428 B1 | 8/2002 | Watanabe et al. |

FOREIGN PATENT DOCUMENTS

| JP | 6-275612 | 9/1994 |
| JP | 11-102911 | 4/1999 |
| JP | 2000-68269 | 3/2000 |

OTHER PUBLICATIONS

Wolf, "Silicon Processing for the VLSI Era, vol. 2—Process Integration," Lattice Press, vol. 2, p. 193.

* cited by examiner

*Primary Examiner*—Long Pham
*Assistant Examiner*—Howard Weiss
(74) *Attorney, Agent, or Firm*—Finnegan, Henderson, Farabow, Garrett & Dunner, L.L.P.

(57) ABSTRACT

A method of forming a cap film comprises a first polishing step of performing a polishing operation at selectivity of R1 (=removal rate for the cap film/removal rate for the insulating film), and a second polishing step of performing a polishing operation at selectivity of R2 (=removal rate for the cap film/removal rate for the insulating film). Each of the polishing operations is performed by using a slurry having the condition of R1>R2. By performing the polishing operations at different selectivity, the cap film free from problems such as dishing of the cap film and the residual cap film on side walls of a recess is formed. Consequently, a semiconductor device having an excellent RC characteristic can be provided.

14 Claims, 8 Drawing Sheets

METHOD OF MANUFACTURING SEMICONDUCTOR DEVICE INCLUDING TWO-STEP POLISHING OPERATION FOR CAP METAL

This is a division of Ser. No. 08/677,743 filed Oct. 3, 2000 now U.S. Pat. No. 6,611,060.

CROSS-REFERENCE TO RELATED APPLICATIONS

This application is based upon and claims the benefit of priority from the prior Japanese Patent Applications No. 11-282404, filed Oct. 4, 1999; and No. 11-282405, filed Oct. 4, 1999, the entire contents of which are incorporated herein by reference.

BACKGROUND OF THE INVENTION

The present invention relates to a damascene structure and a CMP process for forming the damascene structure and, more particularly, to a structure of a barrier film on the upper surface of a Cu wiring and a CMP process for forming the barrier film structure. The invention is directed to achieve reduction in capacity between wirings, assurance of oxidation resistance and preventability of diffusion of Cu, and suppression of increase in wiring resistance.

A semiconductor device in recent years employs a damascene wiring (including a plug) structure from the viewpoints of size reduction and so on. In a multi-level damascene wiring structure, in order to prevent oxidation and diffusion of a metal filled in a groove, to provide an etching stopper and to reduce contact resistance, and so on, it is necessary to provide a cap film made of a material different from the material of the wiring on the upper surface of the wiring. It is important that the cap film is thin. One of the reasons is to prevent deterioration of the wiring performance (or plug performance), specifically, to minimize an RC delay. Another reason is that it is difficult from a process viewpoint to form a wiring (or plug) having a high aspect ratio, that is, a thick film.

The damascene structure will be described hereinbelow by using a wiring as an example. In a conventional technique, a groove for wiring is formed in an insulating film and is filled with a wiring material, thereby forming a wiring. After that, the wiring is etched only by a thickness corresponding to the thickness of a cap film to be formed, thereby forming a recess on the upper surface of the wiring. After that, the material of the cap film is deposited on the entire surface of the semiconductor substrate. By removing the cap film on a field region by CMP (chemical mechanical polishing), the cap film is left only in the groove for wiring. In such a manner, the cap film is formed by being embedded in the groove for wiring.

Figure 1:
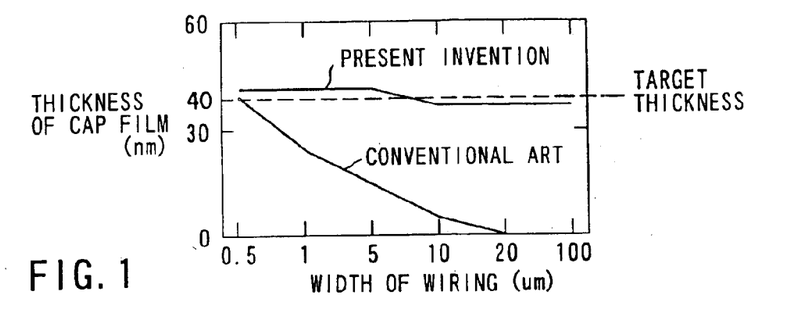
FIG. 1 shows a dependency characteristic of thickness of a finished cap film on the width of a wiring (comparison between a conventional technique and the present invention).

According to the conventional method, however, dishing is caused by the CMP in the cap film on the wiring and controllability with respect to the thickness of the cap film is low. For example, when the width of a wiring is set to 5 $\mu$m, although a cap film having a thickness of 40 nm is tried to be formed, as shown in FIG. 1, the thickness of the cap film becomes 15 nm in practice which is less than the half of the desired value. In an area where the wiring width is wider than 5 $\mu$m, the cap film formed is much thinner. That is, the wiring width dependency on the thickness of the cap film is large, the process controllability is low, and a desired film thickness cannot be obtained in an area where the wiring width is large.

In a further conventional technology, therefore, in the case of making the thickness of the cap film constant, a large amount of the recess is formed in the wiring, so that it is possible that a cap film having a desired thickness can be formed. According to the conventional method, however, the surface of a semiconductor substrate after the cap film on the field region is removed by CMP is very rough, and also the cap film remains on side wall of the groove. It causes the following problems. For example, a deviation occurs between the damascene wiring and a via hole formed on the damascene wiring, so that the contact material with which the via hole is filled is not sufficiently filled and the contact resistance increases. In the case where the cap film is conductive, the electrode area as a capacitor increases only by an amount corresponding to the residual cap film on the side walls of the groove. Consequently, the capacity between wirings increases and the RC delay of the wiring increases.

As described above, the conventional damascene structure and the CMP process for forming the conventional damascene structure have the problem caused by the dishing of the cap film as described in the first conventional example and the problem caused by the residual cap film on the side walls of a groove as described in the second conventional example. The problems obstruct improvement in characteristics. It is an object of the invention to provide a semiconductor device having an excellent RC characteristic by forming a cap film while avoiding the problems.

Hitherto, a TiN film, a TaN film, for example, are proposed to be employed as a film of preventing diffusion of Cu deposited on the surface of a Cu wiring. In order to realize the structure, the upper portion of the Cu wiring formed in the groove of the insulating layer is removed so that the Cu wiring is recessed from a level of the upper surface of the insulating film. Subsequently, a barrier film is formed on the entire surface of a semiconductor substrate. After that, the barrier film on the field region of the insulating film is removed by chemical mechanical polishing (CMP). The barrier film on the Cu film is, however, easily influenced by the state of the surface of the Cu film. It follows that that the diffusion preventability deteriorates in a rough portion caused by particles in the surface of the Cu film and a step portion between the insulating film and the wiring. In some cases, a defect occurs in the barrier layer by dishing and a damage at an edge portion at the time of CMP for forming the barrier layer. In order to ensure sufficient diffusion preventability even when a defect occurs, the barrier film has to be formed thick. Furthermore, the polishing speed of CMP varies in the surface of the wafer. The barrier film therefore has to be thick enough to ensure a high diffusion preventability and, in addition, to compensate the variation. Since such an increase in the thickness of the barrier film reduces the thickness of the wiring in the groove for wiring, effective wiring resistance (wiring resistance for the volume of the-groove) increases. Although it can be considered to deepen the groove in order to decrease the wiring resistance, in this case, the aspect ratio becomes higher. It increases not only the load of processing the groove and filling Cu but also the capacity between wirings since the facing areas of the wirings are enlarged.

It is therefore another object of the invention to provide a barrier film having the structure which can avoid the problems and to suppress diffusion of Cu into an insulating interlayer without increasing the capacity between wirings.

BRIEF SUMMARY OF THE INVENTION

According to a first aspect of the present invention, there is provided a method of manufacturing a semiconductor device, comprising: a step of forming an insulating film on a semiconductor substrate; a step of forming a groove in the insulating film; a step of filling the groove with a wiring material; a step of performing CMP to form a filled wiring; a step of etching the filled wiring material to thereby form a recess; a step of depositing a cap film on the recess formed by etching the wiring material; a first polishing step of performing a polishing operation at selectivity of R1 (=removal rate for the cap film/removal rate for the insulating film); and a second polishing step of performing a polishing operation at selectivity of R2 (=removal rate for the cap film/removal rate for the insulating film), wherein each of the first polishing step and the second polishing step is performed by using a slurry having a condition of R1>R2.

According to the invention, the cap film can be formed in a state where occurrence of dishing on the damascene wiring is suppressed as much as possible.

Preferably, the depth of the recess formed by etching the wiring material is larger than the thickness of the cap film. By satisfying the condition that the recess depth is larger than the thickness of the cap film, occurrence of dishing in the cap film can be suppressed as much as possible in the first polishing step.

In the method of manufacturing a semiconductor device according to the first aspect of the present invention, it is preferable that R1 in the first polishing step is equal to or larger than 1 and R2 in the second polishing step is equal to or smaller than 1.

In the method of manufacturing a semiconductor device according to the first aspect of the present invention, it is preferable that a main component of the cap film is any of Ti, Ta, Nb, W, Cr, V, Pt, and Ru, a nitride, an oxide, a boride, and an alloy of any of the elements, and a mixture of the elements.

In the method of manufacturing a semiconductor device according to the first aspect of the present invention, it is preferable that a main component of the cap film is any of Si, an Si oxide and an Si nitride, or the cap film is a fluorine-doped oxide film or poly-methyl-siloxane.

In the method of manufacturing a semiconductor device according to the first aspect of the present invention, it is preferable that a main component of the wiring material is any of Al, Cu, W, Ru, Ag, Mo, and Si, a nitride, an oxide, a boride and an alloy of any of the elements, and a mixture of any of the elements.

According to a second aspect of the present invention, there is provided a semiconductor device comprising: an insulating film formed on a semiconductor substrate; a groove formed in the insulating film; a first conductive film formed on inner walls of the groove; a second conductive film formed on the inner walls via the first conductive film; and a third conductive film formed so as to cover the upper of the second conductive film, wherein the level of the surface of the insulating film near the first conductive film is gradually lowered from a position close to the first conductive film.

According to a third aspect of the present invention, there is provided a semiconductor device comprising: a first insulating film formed on a semiconductor substrate; a groove formed in the first insulating film; a second insulating film formed on inner walls of the groove; a conductive film formed n the inner walls via the second conductive film; and a third insulating film formed so as to cover the upper of the conductive film, wherein the surface of the first insulating film and the surface of the third insulating film in the center portion of the groove are almost at the same level, and the surface of the second insulating film and ends of the third insulating film are higher than the level.

According to a fourth aspect of the present invention, there is also provided a semiconductor device having a filled Cu wiring structure formed in an insulating film, wherein a layer made of Al or an Al alloy is formed on the upper surface of a Cu wiring portion via an intermediate layer.

As described above, by using the structure in which a layer made of Al or an Al alloy is formed on the upper surface of a Cu wiring via an intermediate layer, even if Cu is leaked, Cu is captured in the Al layer. Consequently, diffusion of Cu is suppressed. Since Al has low resistance, even when an Al layer is formed thick to assure margin or the like, increase in the effective resistance caused by a barrier layer formed on the wiring can be minimized.

Preferably, the intermediate layer contains at least one element selected from Ti, Zr, V, W, Ta, Nb, Cr, Sn, Co and Ru.

Each of the elements has the function of preventing diffusion of Al into the Cu wiring, thereby preventing increase in wiring resistance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the invention will be described hereinbelow with reference to the drawings.

A first embodiment of the invention is referred to a method of forming a cap film made of TaN on the upper surface of a Cu damascene wiring. The cap film is formed to prevent diffusion of the Cu wiring and oxidation of the Cu wiring, to protect the Cu wiring at the time of opening a connection hole and to reduce contact resistance of the Cu wiring.

Figure 2A:
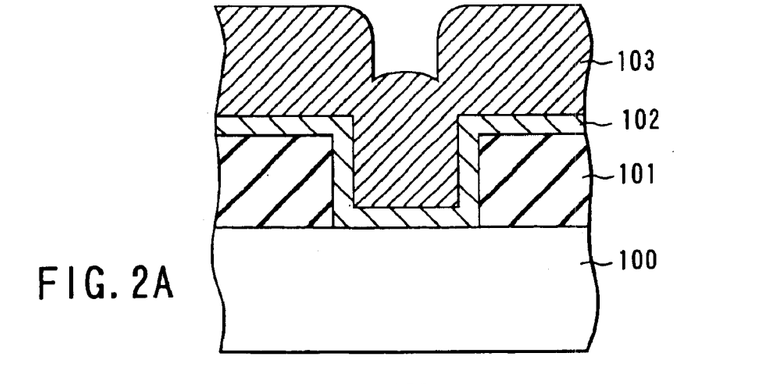
FIGS. 2A to 2D are cross sectional views of device structures in manufacturing steps of a method of manufacturing a semiconductor device according to a first embodiment of the invention.

As shown in FIG. 2A, an insulating film 101 made of, for example $SiO_2$, is formed on the entire surface of a semiconductor substrate 100. A groove for a wiring having a depth of 400 nm is formed in the insulating film 101 by lithography and etching. A TaN film 102 is deposited to 20 nm by sputtering on the entire surface of the semiconductor substrate 100 and a Cu film 103 is deposited to 800 nm by sputtering. The TaN film 102 is necessary as a diffusion preventing layer surrounding the bottom surface and side surface of the Cu film.

Figure 2B:
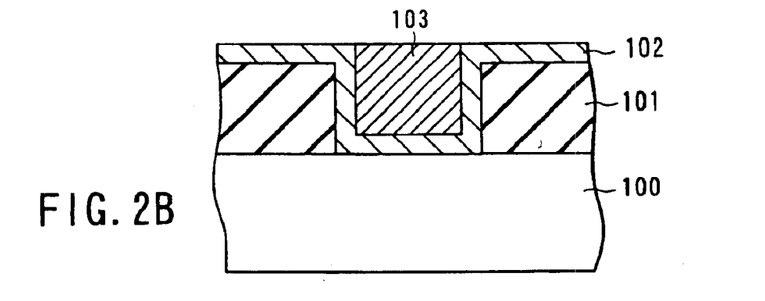

As shown in FIG. 2B, an unnecessary portion of the Cu film 103, that is, the Cu film 103 on the field region is removed by CMP, thereby leaving the Cu film 103 only in the groove for wiring, that is, a wiring portion. The CMP is carried out for 120 seconds by, for example, using an alumina-series slurry containing ammonium persulfate and quinaldinic acid with the parameters of PH8, TR/TT (rotation ratio of top ring/turn table) of 60/100, and a pad of IC1000 (surface layer)/Suba400 (underlayer). At this stage, the TaN film 102 is not removed but is left on the field region. In the case where the insulating film 101 is not damaged by the CMP performed on the TaN film 102 at this stage or the following etching process performed on the Cu film 103, there is no problem from a process viewpoint to remove the TaN film 102 at this stage.

Figure 2C:
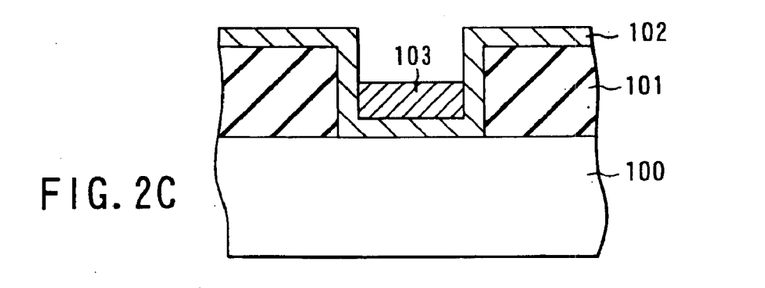

As shown in FIG. 2C, the Cu film 103 of the wiring portion is recessed to about 100 nm. The recess is formed by, for example, either dry etching such as RIE using a chlorine gas or by wet etching using a mixed solution of ammonium persulfate as an etching solution and quinaldinic acid as an inhibitor of suppressing grain boundary etching.

Figure 2D:
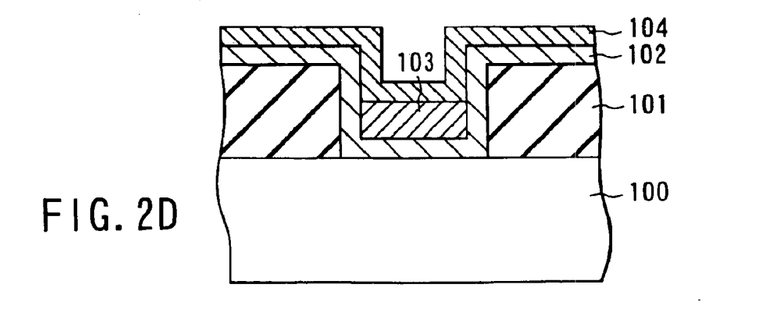

As shown in FIG. 2D, a TaN film 104 is deposited to 20 nm on the entire surface of the semiconductor substrate 100.

Figure 3A:
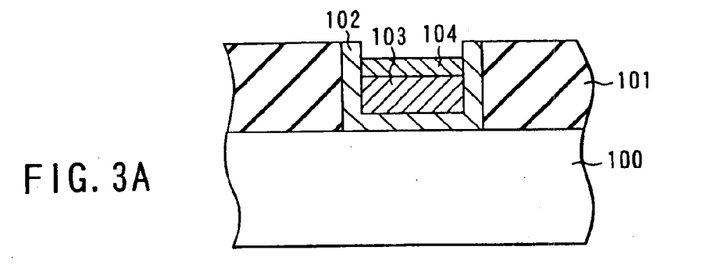
FIGS. 3A and 3B are cross sectional views of device structures in manufacturing steps of the manufacturing method subsequent to FIGS. 2A to 2D.

As shown in FIG. 3A, the TaN films 104 and 102 on the field region are removed in a first polishing step by CMP so as to leave the TaN films 104 and 102 only in the groove for wiring, that is, the wiring portion, thereby obtaining the cap film on the Cu film 103. Subsequently, as shown in FIG. 3B, in a second polishing step by CMP, the insulating film 101 and the TaN film 102 are polished to the upper surface of the TaN film 104.

In the first polishing step in FIG. 3A, in order to prevent deterioration in the yield of the device caused by short-circuiting between Cu films 103, it is necessary to completely remove the TaN films 102 and 104 on the field region. Furthermore, it is desirable that the process time is shortened. Accordingly, it is desirable that the removal rate for TaN is high. On the other hand, in order to suppress the damage on the TaN film 104 on the Cu film 103 as much as possible, it is necessary that the insulating film 101 remains firmly so that a step between the insulating film 101 and the TaN film 104 on the Cu film 103 is maintained. For this purpose, it is desired that the removal rate for the insulating film 101 is low.

Figure 4:
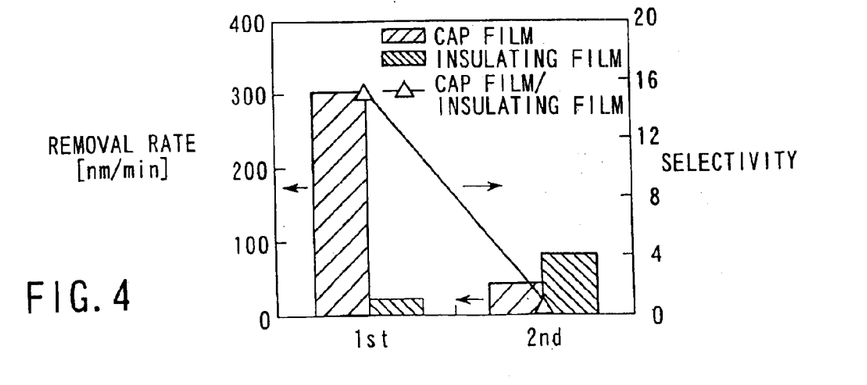
FIG. 4 is a characteristic diagram of a removal rate and selectivity referred to with respect to the method of manufacturing a semiconductor device according to the first embodiment of the invention.

That is, a slurry used in the first polishing step desirably has characteristics such that, as shown in FIG. 4, the removal rate for the TaN film 104 is high and that of polishing the insulating film 101 is low. A desirable slurry is, for instance, a silica-series slurry. In the first polishing step in the embodiment, a silica-series slurry is used and polishing is performed for 60 seconds with the parameters of PH2, TR/TT of 60/100, and a pad of IC1000/Suba400. When it is assumed that (removal rate for the cap film 104)/(removal rate for the insulating film 101)=R1, the condition of R1>1 is obtained.

Figure 3B:
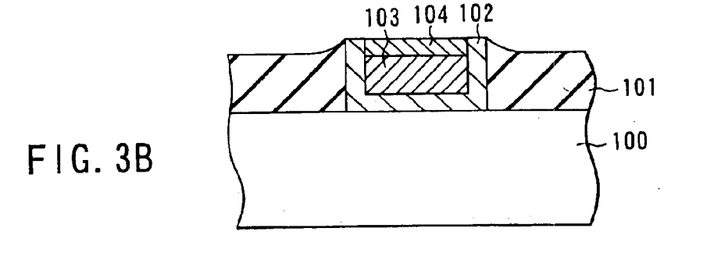

In the second polishing step in FIG. 3B, in order to remove the step of the insulating film 101 with respect to the TaN film 104, it is desirable that the removal rate for insulating film 101 is high. On the other hand, in order to minimize a damage to the cap film on the Cu film 103, that is, the TaN film 104, it is desirable that the removal rate for the TaN film 104 is as low as possible.

That is, a slurry used for the second polishing step has, as shown in FIG. 4, a high removal rate for the insulating film 101 and a low removal rate for the TaN film 104 and does not cause grain boundary etching. A desirable slurry is, for example, an alkaline silica-series slurry to which malonic acid is added. In the second polishing step in the embodiment, for example, an alkaline silica-series slurry to which malonic acid is added is used and polishing is performed for 120 seconds with the parameters of PH12, TR/TT of 60/100 and a pad of IC1000/Suba400. When it is assumed that (removal rate for the cap film 104)/(removal rate for the insulating film 101)=R2, the condition of R2<1 is obtained. The TaN film 102 on the side walls of the recess is removed since a heavy load of the polishing is locally applied onto the side wall of the recess.

By the manufacturing process as described above, the TaN film 104 which has subjected to minimum dishing and functions as a high quality barrier can be formed. That is, the TaN film 104 functioning as a high quality barrier can be formed to a desired thickness with high controllability. Also, the TaN film 102 on the side wall of the recess can be removed. By using the slurry having the characteristics as described above in the second polishing step, the level of surface of the insulating film 101 is gradually lowered from the position near the TaN film 102. That is, by using the slurry having the characteristics as described above in the second polishing step, the insulating film 101 is dished.

A second embodiment of the invention is referred to a method of forming a cap film made of SiN on the upper surface of a damascene wiring made of W (tungsten). The structure can be applied to a case such that a gate electrode is covered with an SiN film. The cap film is used as an insulating layer to protect the wiring material layer and as an etching stopper against RIE.

Figure 5A:
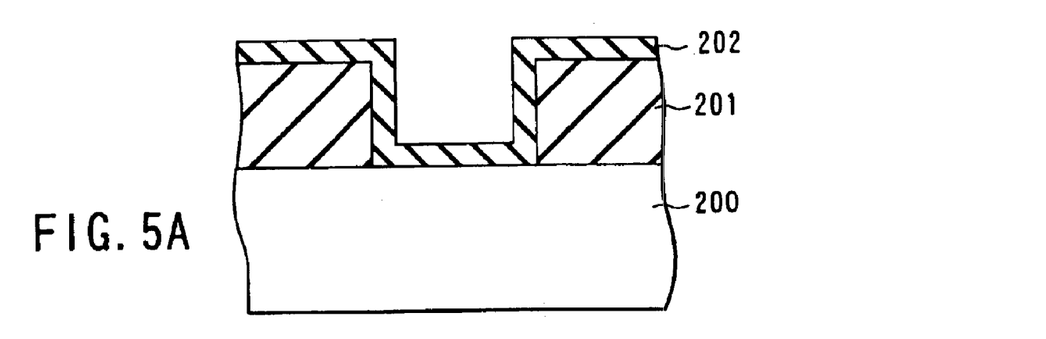
FIGS. 5A to 5C are cross sectional views of device structures in manufacturing steps of a method of manufacturing a semiconductor device according to a second embodiment of the invention.

First, as shown in FIG. 5A, an insulating film 201 of, for example $SiO_2$, is formed on the entire surface of a semiconductor substrate 200. Then, a groove for wiring is formed to a depth of 400 nm in the insulating film 201 by lithography and etching. An SiN film 202 is deposited to 20 nm on the entire surface of the semiconductor substrate 200 by LP (Low-Pressure)-CVD (Chemical Vapor Deposition).

Figure 5B:
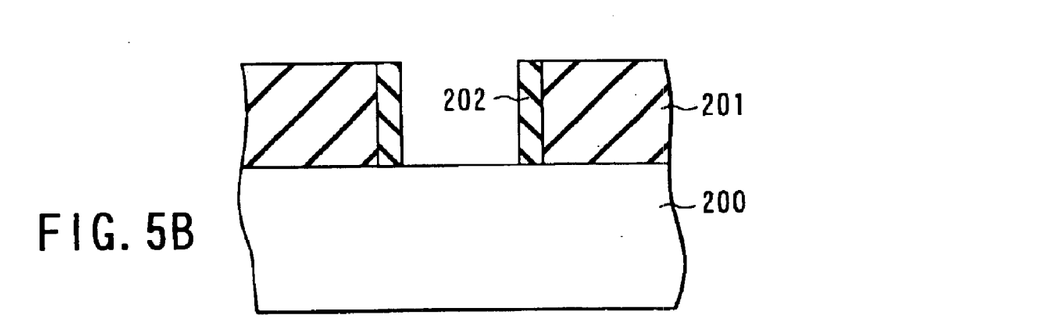

As shown in FIG. 5B, the SiN film 202 on the field region of the insulating film 201, is removed by etch-back RIE (Reactive Ion Etching) using CHF3 gas, thereby leaving the SiN film 202 only on the side wall of the groove.

Figure 5C:
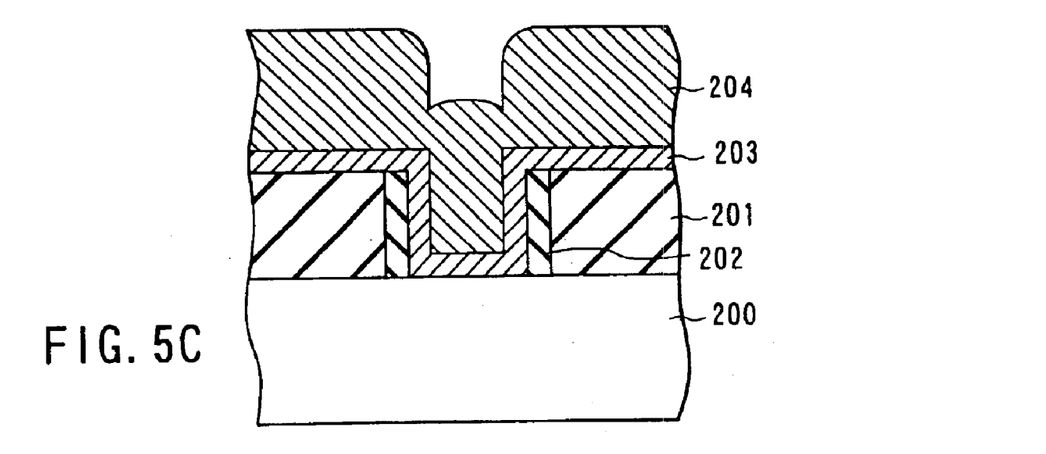

As shown in FIG. 5C, as a seed layer of W (tungsten), a superposed film 203 of Ti (lower layer)/TiN (upper layer) is deposited to 10 nm/20 nm by sputtering, and a W film 204 is deposited to 550 nm by CVD.

Figure 6A:
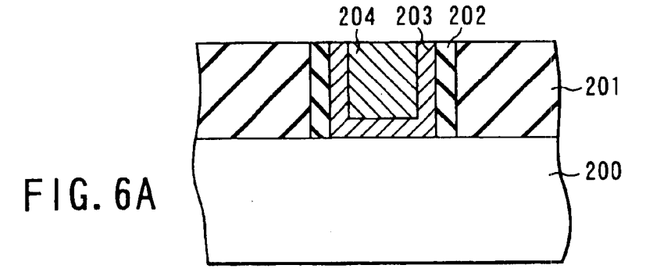
FIGS. 6A to 6C are cross sectional views of device structures in manufacturing steps of the manufacturing method subsequent to FIGS. 5A to 5C.

Then, as shown in FIG. 6A, the W film 204 and the Ti/TiN film 203 on the field region of the insulating film 201 are removed by CMP. In the CMP, for example, an alumina-series slurry containing ferric nitrate is used and polishing is performed for 120 seconds with the parameters of PH1.5, TR/TT of 60/100 and a pad of IC1000/Suba 400.

Figure 6B:
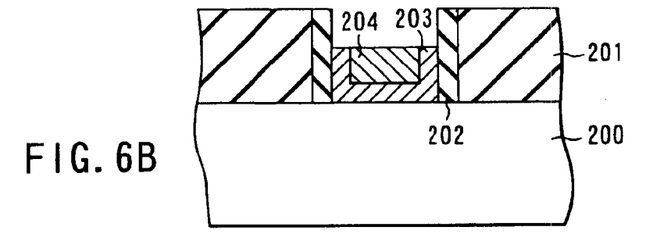

Subsequently, as shown in FIG. 6B, the W film 204 and the Ti/TiN film 203 on the side wall are etched about 100 nm by dry etching using a chlorine gas and a fluorine gas, thereby forming a recess.

Figure 6C:
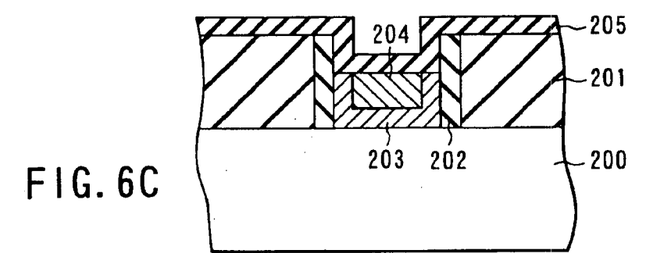

Thereafter, as shown in FIG. 6C, an SiN film 205 is deposited to 20 nm by sputtering on the entire surface of the semiconductor substrate 200.

Figure 7A:
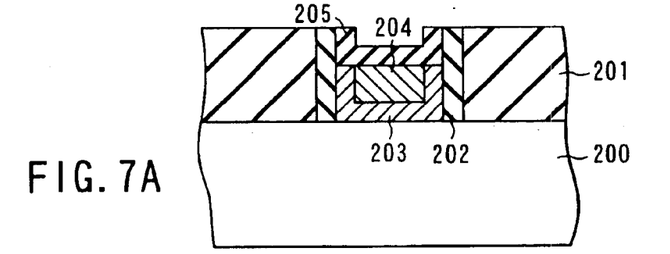
FIGS. 7A and 7B are cross sectional views of device structures in manufacturing steps of the manufacturing method subsequent to FIGS. 6A to 6C.

After that, as shown in FIG. 7A, the SiN film 205 on the field region is removed in the first polishing step. Then, as shown in FIG. 7B, the insulating film 201 and SiN films 202 and 205 are polished to the upper surface of the SiN film 205 in the second polishing step.

The slurry used in the first polishing step in FIG. 7A has the characteristics that the removal rate for SiN is high and the removal rate for the insulating film is low. A desirable slurry is, for example, a silica-series slurry containing phosphoric acid. In the first polishing step in the embodiment, for example, a silica-series slurry containing phosphoric acid is used and polishing is performed for 120 seconds with the parameters of PH1.5, TR/TT of 50/50 and a pad of IC1000/Suba400. When it is assumed that (removal rate for the cap film 205)/(removal rate for the insulating film 201)=R1, the condition of R1>1 is obtained.

Figure 7B:
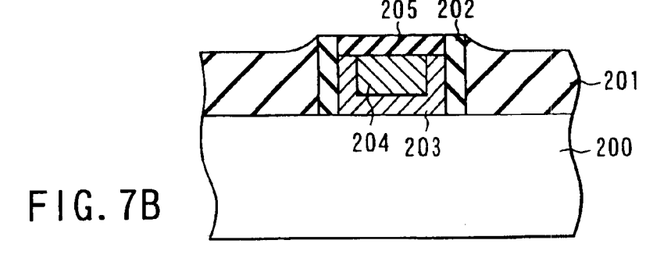

In the second polishing step in FIG. 7B, in order to remove the step of the insulating film 201 with respect to the SiN film 205, it is desirable that the removal rate for the insulating film 201 is high. On the other hand, in order to minimize a damage on the SiN cap film 205 on the tungsten (W) film 204, it is desirable that the removal rate for the SiN film 205 is as low as possible.

The slurry used in the second polishing step has the high removal rate for the insulating film and the low removal rate for SiN, and does not cause grain boundary etching. A desirable slurry is, for example, a silica-series slurry. In the embodiment, a silica-series slurry is used and polishing is performed for 120 seconds with the parameters of PH12, TR/TT of 50/50 and a pad of IC1000/Suba400. When it is assumed that (removal rate for the cap film 205)/(removal rate for the insulating film 201)=R2, the condition of R2<1 is obtained. The SiN films 202 and 205 on the side wall of the recess are removed by a heavy load of the polishing is locally applied onto side wall of the recess.

By performing the polishing in the plurality of steps as described above, the SiN cap film 205 which is minimally dished can be formed. That is, the SiN cap film 205 can be controlled to a desired thickness. The SiN film 205 on the side walls of the recess can be also removed. In the second polishing step using the slurry having the above-described selectivity, the upper end portion of the SiN film 205 is slightly projected in a round shape. According to such a structure, in an RIE process in the case where an insulating film (not shown) is formed in the following manufacturing step and an SAC (Self Align Contact) step is performed, concentration of plasma on the upper end portion of the SiN film 205 is suppressed, thereby reducing a local damage on a device.

A third embodiment of the invention will be described with reference to FIGS. 8A to 8D and FIGS. 9A and 9B. The third embodiment of the invention is referred to a method of forming a cap film made of TiN on the upper surface of an Al (aluminium) damascene wiring. The cap film in the embodiment is used to suppress reflection on the surface of the Al film in a lithography process.

Figure 8A:
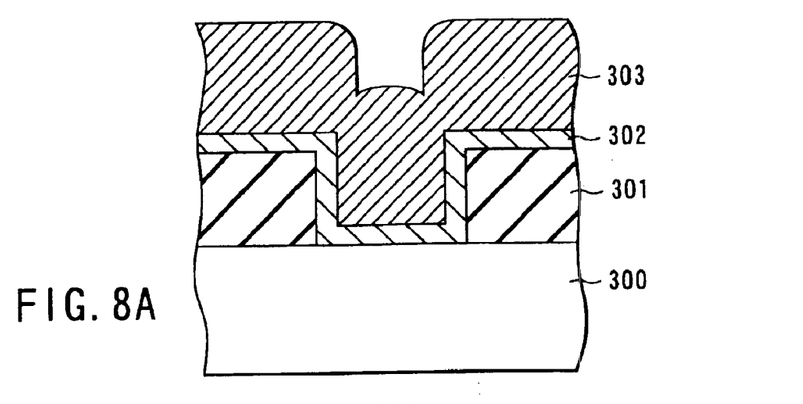
FIGS. 8A to 8D are cross sectional views of device structures in manufacturing steps of a method of manufacturing a semiconductor device according to a third embodiment of the invention.

As shown in FIG. 8A, an insulating film 301 made of, for example, $SiO_2$ is formed on the entire surface of a semiconductor substrate 300. Then, a groove for wiring having a depth of 400 nm is formed in the insulating film 301 by lithography and etching. An NbN film 302 is deposited to 20 nm on the entire surface of the semiconductor substrate 300 by sputtering and an Al film 303 is deposited to 800 nm by sputtering. The NbN film 302 functions as a liner of Al.

Figure 8B:
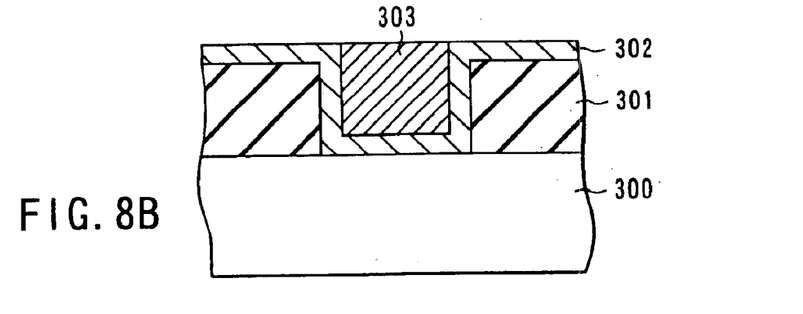

As shown in FIG. 8B, an unnecessary portion of the Al film 303, that is, the Al film 303 on the field region is removed by CMP, thereby leaving the Al film 303 only in the groove for wiring, that is, a wiring portion. The CMP is carried out for 120 seconds by, for example, using an alumina-series slurry containing quinaldinic acid with the parameters of PH5, TR/TT of 60/100, and a pad of IC1000 (surface layer)/Suba400 (underlayer). At this stage, the NbN film 302 is not removed but is left on the field region. In the case where the insulating film 301 is not damaged by the CMP performed on the NbN film 302 at this stage or the following etching process performed on the Al film 303, there is no problem from a process viewpoint to remove the NbN film 302 at this stage.

Figure 8C:
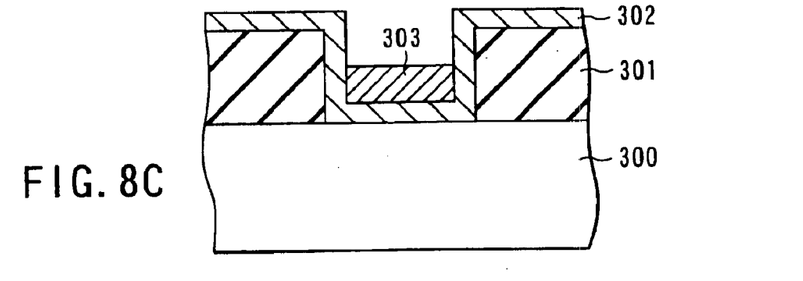

As shown in FIG. 8C, the Al film 303 of the wiring portion is recessed to about 100 nm. The recess is formed by, for example, dry etching such as RIE using a chlorine gas.

Figure 8D:
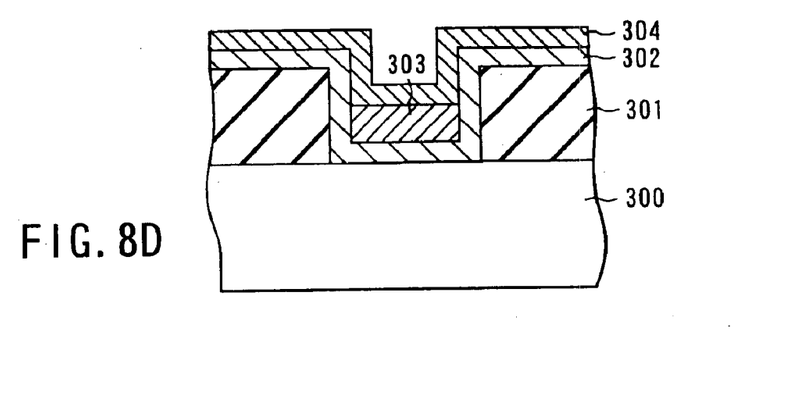

As shown in FIG. 8D, a TiN film 304 is deposited to 20 nm on the entire surface of the semiconductor substrate 300.

Figure 9A:
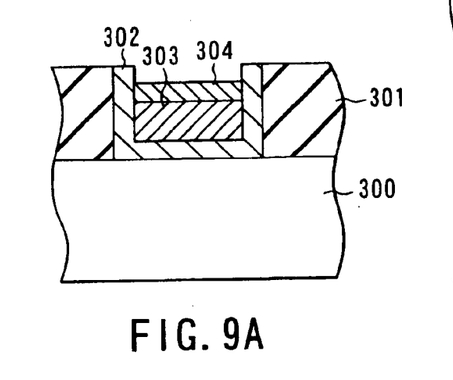
FIGS. 9A and 9B are cross sectional views of device structures in manufacturing steps of the manufacturing method subsequent to FIGS. 8A to 8D.

As shown in FIG. 9A, the TiN films 304 and the NbN film 302 on the field region are removed in a first polishing step by CMP so as to leave the TiN film 304 only in the groove for wiring, that is, the wiring portion, thereby obtaining the cap film on the Al film 303. Subsequently, as shown in FIG. 9B, in a second polishing step by CMP, the insulating film 301 and the NbN film 302 are polished to the upper surface of the TiN film 304.

In the first polishing step in FIG. 9A, in order to prevent deterioration in the yield of the device caused by short-circuiting between Al films 303, it is necessary to completely remove the NbN films 302 and the TiN film 304 on the field region. Furthermore, it is desirable that the process time is shortened. Accordingly, it is desirable that the removal rate for TiN and NbN is high. On the other hand, in order to suppress the damage on the TiN film 304 on the Al film 303 as much as possible, it is necessary that the insulating film 301 remains firmly so that a step between the insulating film 301 and the TiN film 304 on the Al film 303 is maintained. For this purpose, it is desired that the removal rate for the insulating film 301 is low.

That is, a slurry used in the first polishing step desirably has characteristics such that, the removal rate for the TiN film 304 and the NbN film 302 is high and that of polishing the insulating film 301 is low. A desirable slurry is, for instance, a silica-series slurry. In the first polishing step in the embodiment, a silica-series slurry is used and polishing is performed for 60 seconds with the parameters of PH2, TR/TT of 60/100, and a pad of IC1000/Suba400. When it is assumed that (removal rate for the TiN cap film 304)/ (removal rate for the insulating film 301)=R1, the condition of R1>1 is obtained.

Figure 9B:
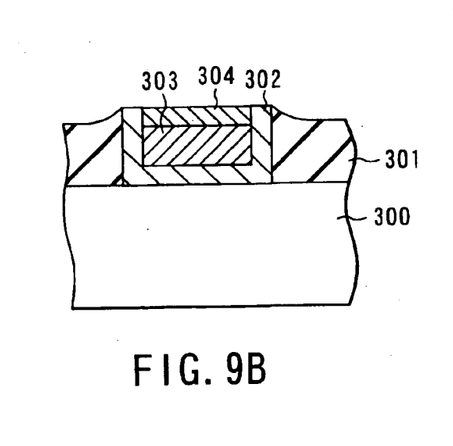

In the second polishing step in FIG. 9B, in order to remove the step of the insulating film 301 with respect to the TiN film 304, it is desirable that the removal rate for insulating film 301 is high. On the other hand, in order to minimize a damage to the cap film on the Al film 303, that is, the TiN film 304, it is desirable that the removal rate for the TiN film 304 is as low as possible.

That is, a slurry used for the second polishing step has a high removal rate for the insulating film 301 and a low removal rate for the TiN film 304 and does not cause grain boundary etching. A desirable slurry is, for example, an alkaline silica-series slurry to which malonic acid is added. In the second polishing step in the embodiment, for example, an alkaline silica-series slurry to which malonic acid is added is used and polishing is performed for 120 seconds with the parameters of PH12, TR/TT of 60/100 and a pad of IC1000/Suba400. When it is assumed that (removal rate for the TiN cap film 304)/(removal rate for the insulating film 301)=R2, the condition of R2<1 is obtained. The NbN film 302 on the side wall of the recess is removed since a heavy load of the polishing is locally applied onto the side wall of the recess.

By the manufacturing process as described above, the TiN film 304 which has subjected to minimum dishing and functions as a high quality barrier can be formed. That is, the TiN film 304 functioning as a high quality barrier can be formed to a desired thickness with high controllability. Also, the NbN film 302 on the side wall of the recess can be removed. By using the slurry having the characteristics as described above in the second polishing step, the level of surface of the insulating film 301 is gradually lowered from the position near the NbN film 302. That is, by using the slurry having the characteristics as described above in the second polishing step, the insulating film 301 is dished.

In the above mentioned embodiments, various modifications and applications of polishing parameters such as a slurry, a pad or the like, process conditions such as a stack layer structure, materials, and film thickness, and so on are possible without departing from the scope of the present invention.

For example, although the materials of the cap film have been described as TaN, SiN and TiN, according to a purpose selected from the prevention of diffusion of a wiring, prevention of oxidation, prevention of reflection, prevention of etching (etching stopper), reduction of contact resistance, and improvement of reliability, a material having a main component selected from Ti, Ta, Nb, W, Cr, V, Pt and Ru, nitrides, oxides, borides, and alloys of the elements, and a mixture of the elements can be used as the materials of the cap film. Also, a material having a main component selected from Si, Si oxide, Si nitride, a fluorine-doped Si oxide, or poly-methyl-siloxane can be used as the materials of the cap film.

A fourth embodiment of the invention will be described hereinbelow with reference to the drawings.

The fourth embodiment of the invention relates to a method of forming a barrier layer made of Al/TaN on the upper surface of a Cu damascene wiring. The barrier layer formed on the upper surface of the wiring is used to prevent diffusion of Cu and oxidation.

Figure 10A:
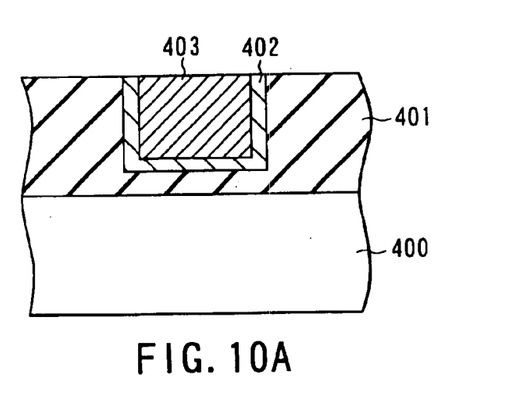
FIGS. 10A to 10C are cross sectional views of device structures in manufacturing steps of a method of manufacturing a semiconductor device according to a fourth embodiment of the invention.

First, as shown in FIG. 10A, an insulating film 401 of a thermal oxide film of 100 nm, a p-SiN film of 30 nm, and a CVD oxide film of 400 nm is deposited on the semiconductor substrate 400. A wiring pattern groove having a depth of 400 nm is formed in the CVD oxide film by lithography and etching. The wiring pattern is a wiring having L/S of 0.4/0.4 $\mu$m and a length of 1.5 mm. Electrode pads, not shown, are connected to both ends of the wiring.

The TaN film 402 is deposited to 20 nm by sputtering and a Cu film is deposited to 200 nm by sputtering. The TaN film 402 is necessary as a diffusion preventing layer surrounding the bottom surface and side surfaces of the Cu film.

The Cu film is filled, i.e., buried, by plating and is subjected to CMP, thereby forming a Cu wiring 403.

Figure 10B:
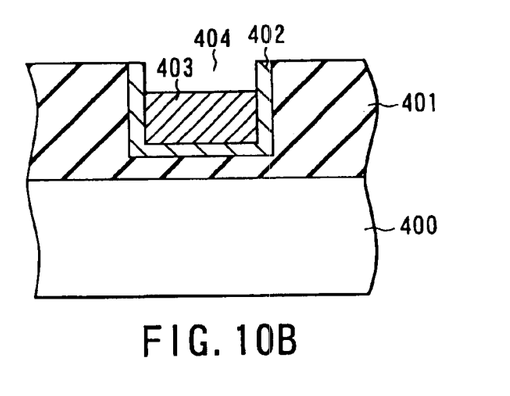

As shown in FIG. 10B, by etching the surface of the Cu wiring 403 with an acid, a recess 404 having a depth of 70 nm is formed.

Figure 10C:
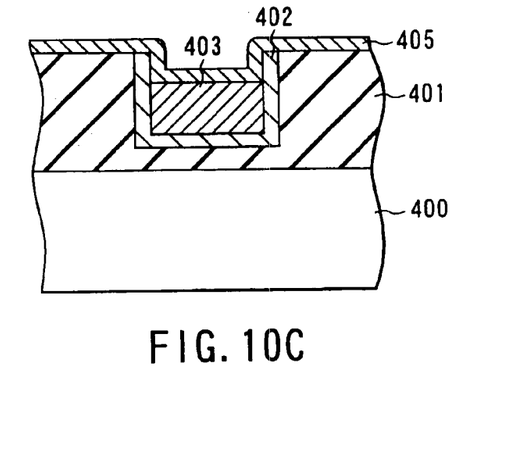
Figure 11A:
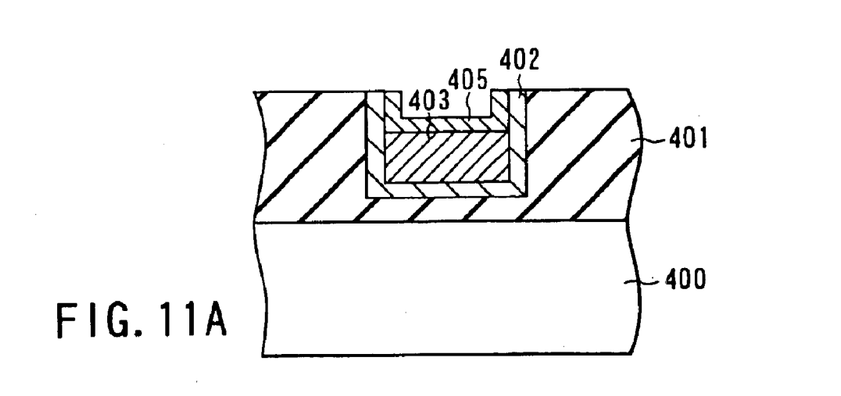
FIGS. 11A to 11C are cross sectional views of device structures in manufacturing steps of the manufacturing method subsequent to FIGS. 10A to 10C.

Subsequently, as shown in FIG. 10C, a TaN film 405 is deposited to 50 nm. As illustrated in FIG. 11A, the TaN film 405 is subjected to a CMP process but is left on the upper of the Cu wiring 403. In this case, a part of the TaN film 405 is thinned to about 30 nm by dishing.

Figure 11B:
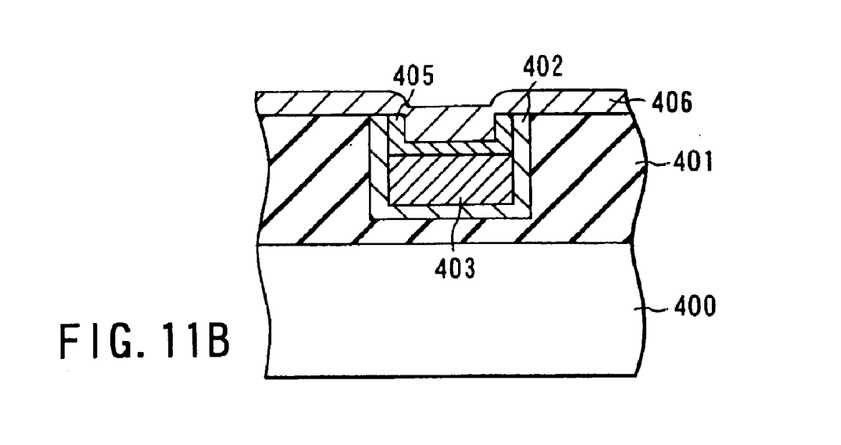
Figure 11C:
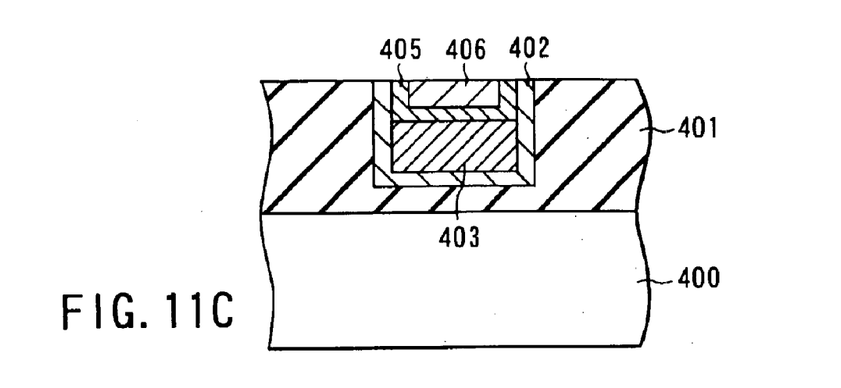

After depositing the Al film 406 to 50 nm on the entire surface by sputtering as shown in FIG. 11B, the Al film 406 on the insulating film 401 is removed by CMP in FIG. 11C. The method of forming the Al film 406 is not limited to sputtering, but selective CVD or the like can be also used. Since the step is small, it can be sufficiently covered by sputtering without heating. In order to obtain more preferable coverage of Al, however, it is desirable to heat the substrate within a range that Cu is not diffused.

A fifth embodiment of the invention will now be described with reference to the drawings.

The fifth embodiment of the invention relates to a method of forming a barrier layer made of Al/TiN on the upper surface of a Cu damascene wiring. A point different from the fourth embodiment is that, in the order of steps, the CMP process to the barrier layer on the wiring is performed at the second stage after stacking interlayers TiN and Al. The barrier layer on the wiring is used to prevent diffusion of the Cu film and prevent oxidation.

Figure 12A:
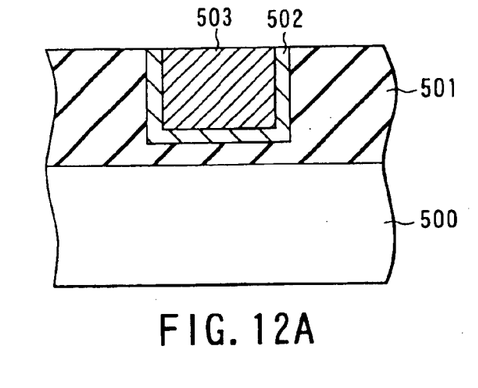
FIGS. 12A to 12C are cross sectional views of device structures in manufacturing steps of a method of manufacturing a semiconductor device according to a fifth embodiment of the invention.

First, as shown in FIG. 12A, in a manner similar to the fourth embodiment, a wiring structure in which the TaN film 502 and the Cu wiring 503 are filled in the insulating film 501 on the semiconductor substrate 500 is obtained.

Figure 12B:
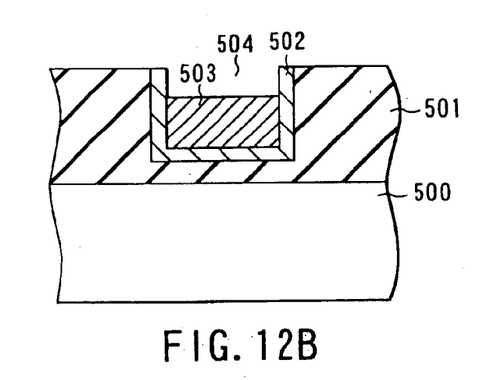

As shown in FIG. 12B, by etching the surface of the Cu wiring 503 with an acid, a recess 504 having a depth of 50 nm is formed.

Figure 12C:
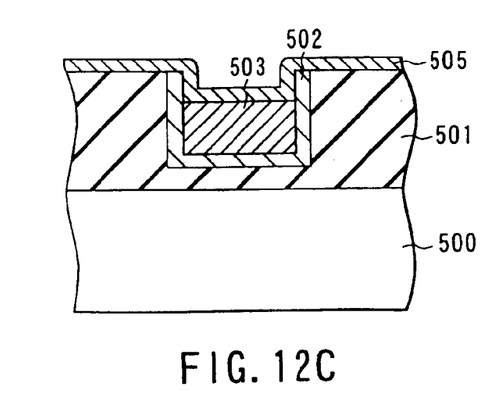
Figure 13A:
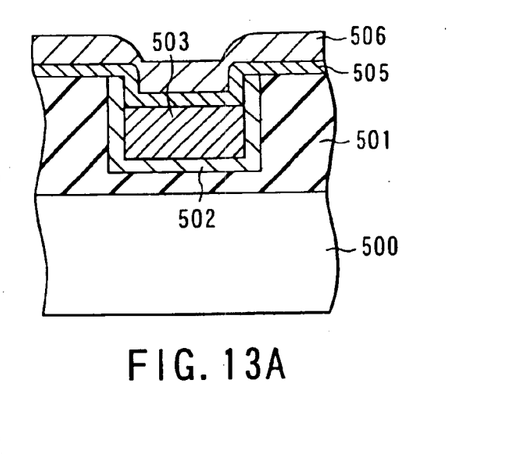
FIGS. 13A and 13B are cross sectional views of device structures in manufacturing steps of the manufacturing method subsequent to FIGS. 12A to 12C.

Subsequently, a TiN film 505 is deposited to 20 nm on the entire surface by sputtering as shown in FIG. 12C, and an Al film 506 is deposited to 50 nm by sputtering as shown in FIG. 13A.

Figure 13B:
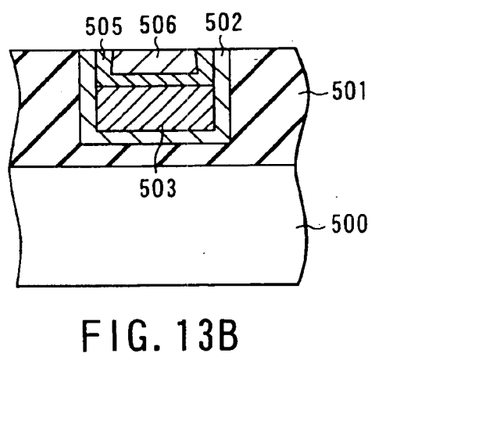

Then, as shown in FIG. 13B, by removing the Al film 506 and the TiN film 505 on the field region by CMP of two stages, a barrier film constructed by the Al film 506 and the TiN film 505 is left only on the Cu wiring 503.

According to the fifth embodiment, the method has advantages such that the TiN film 505 is not dished and the number of steps can be reduced since the Al film 506 and TiN film 505 on the field region are removed by the continuous steps of the two-stage CMP.

Two comparative examples according to the conventional techniques with respect to the fourth and fifth embodiments will be described hereinbelow.

COMPARATIVE EXAMPLE I

The comparative example I relates to a method of forming a recess having a depth of 50 nm in the Cu damascene wiring and a barrier layer made of TaN is formed on the upper surface of the wiring.

On a semiconductor substrate, an insulating film comprised of a thermal oxide film of 100 nm, a p-SiN film of 30 nm, and a CVD oxide film of 400 nm is deposited. A wiring pattern groove having a depth of 400 nm is formed in the CVD oxide film by lithography and etching.

Then, a TaN film is deposited to 20 nm by sputtering, and a Cu film is deposited to 200 nm by sputtering.

The Cu film is filled by plating and is subjected to CMP, thereby forming a Cu wiring. After that, a recess having a depth of 50 nm is formed by etching the surface of the Cu wiring with an acid.

A TaN film is deposited to 50 nm on the entire surface of the wafer. The TaN film on the field portion is then removed by CMP so that only the TaN film on the Cu wiring is left. In this case, a part of the TaN film is thinned to about 30 nm by dishing.

COMPARATIVE EXAMPLE II

The comparative example II relates to a method of forming a recess having a depth of 100 nm in a Cu damascene wiring and a barrier layer made of TaN is formed on the upper surface of the wiring.

On a semiconductor substrate, an insulating film comprised of a thermal oxide film of 100 nm, a p-SiN film of 30 nm, and a CVD oxide film of 400 nm is deposited. A wiring pattern groove having a depth of 400 nm is formed in the CVD oxide film by lithography and etching.

Then, a TaN film is deposited to 20 nm by sputtering, and a Cu film is deposited to 200 nm by sputtering.

The Cu film is filled by plating and is subjected to CMP, thereby forming a Cu wiring. After that, a recess having a depth of 100 nm is formed by etching the surface of the Cu wiring with an acid.

A TaN film is deposited to 100 nm on the entire surface of the wafer. The TaN film on the field portion is then removed by CMP so that only the TaN film on the Cu wiring is left. In this case, a part of the TaN film is thinned by dishing but the TaN film remains about 70 nm at the thinnest portion.

As described above, the samples formed by fourth and fifth embodiments and the first and second comparative examples were subjected to wiring resistance measurement and a barrier effectiveness test. The barrier effectiveness test was carried out by depositing a silicon oxide film of 1 μm by CVD on a wafer on which the barrier film was formed, performing heat treatment at 450° C. for 40 hours, dissolving the insulating film, and measuring Cu density in the film. A silicon oxide film deposited on an Si wafer was used for comparison. When the Cu density increased, it was determined that Cu was diffused through the barrier film. Table shows the results of the measurement.

In the case where the recess has the depth of 50 nm and the thickness of the deposited TaN film is 50 nm as in the comparative example I, the wiring resistance is good. However, it is understood that since the TaN film is thinned by dishing, the barrier effectiveness deteriorates and Cu is diffused into the insulating film. Although the film thickness measured at the thinnest position is 30 nm which is thicker than the TaN film on the side surfaces and the bottom surface, the barrier effectiveness deteriorates due to the rough surface of the Cu film caused by particles and the like and insufficient coverage in a step between the insulating film and the Cu wiring.

In the comparative example II, by setting the depth of the recess to 100 nm and the thickness of the TaN deposition to 100 nm to make the TaN film on the Cu wiring thick, the barrier effectiveness is improved. Due to the decrease in the Cu amount in the groove, however, the wiring resistance increases. When the groove is made deeper to 1 μm in order to assure the thickness of the Cu film, the aspect ratio is too high. Consequently, the Cu wiring is not sufficiently filled in a part of the wafer.

On the contrary, the fourth and fifth embodiments show preferable wiring resistance characteristic. Although the TaN film is thinned by dishing in the fourth embodiment, and although only the TiN film of 20 nm is formed in the fifth embodiment, it is understood from the table that Cu is not diffused into the insulating film. This indicates that it is sufficient for the TaN film or the TiN film that these films prevent Al from diffusing into Cu, since in the case where Cu is diffused, it is alloyed and captured in the Al film, and moreover, an oxide film on the surface of the Al film functions as a diffusion preventing film. As the result, a high-performance wiring having low wiring resistance can be realized.

In the step of performing the CMP process on the barrier layer on the upper of the wiring, in the fourth embodiment, the CMP process is performed each time each of the two kinds of materials constructing the recess cap is stacked. In the fifth embodiment, the CMP process of two stages is performed after stacking the two kinds of materials. The order of steps can be replaced with each other between the fourth and fifth embodiments. For example, in the fourth embodiment, the CMP process of two stages can be performed after stacking the two kinds of materials.

In the fourth and fifth embodiments, various modifications and applications of conditions of materials and film thickness, and the like are possible without departing from the scope of the present invention. For example, it is sufficient that the intermediate layer prevents diffusion of Al into the Cu wiring, thereby preventing increase in the wiring resistance. The intermediate layer contains at least one element selected from Ti, Zr, V, W, Ta, Nb, Cr, Sn, Co and Ru, or a nitride, an oxide, a boride, and a carbide of any of the elements. Although the case of applying the invention to Cu as the material of the wiring layer has been described, the invention can be also applied to Ag.

TABLE

|  | FIRST EMBODIMENT | SECOND EMBODIMENT | COMPARATIVE EXAMPLE 1 | COMPARATIVE EXAMPLE 2 |
|---|---|---|---|---|
| EFFECTIVE WIRING RESISTANCE ($\mu \cdot \Omega \cdot cm$) | 2.1 | 2.1 | 2.1 | 2.8 |
| BARRIER EFFECTIVENESS TEST | OK | OK | NG | OK |
| OVER-ALL JUDGEMENT | ○ | ○ | X | Δ |

As described above, according to the first to third embodiments of the present invention, a cap film can be formed in a state where occurrence of dishing on the damascene wiring is suppressed as much as possible.

Also as described above, according to the fourth and fifth embodiments of the present invention, Cu is captured by being alloyed with Al or an Al alloy formed via an intermediate layer and, further, the oxide film existing on Al or an Al alloy functions as a diffusion preventing film. Thus, the capacity between wirings can be reduced and the high-performance wiring with low wiring resistance can be realized. When the thickness of the Al or Al alloy film is 20 nm or more, the film functions as an effective barrier. Consequently, in consideration of a margin of CMP, although it is sufficient that the thickness of a finish film is about 20 nm, it is also possible to set the thickness to 20 nm or more in order to achieve higher barrier effectiveness. Since Al or Al alloy has low resistance, even when the film thickness is increased to a certain extent, the wiring resistance does not increase so much.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

forming an insulating film on a semiconductor substrate;

forming a groove in the insulating film;

filling the groove with a wiring material;

performing CMP to form a filled wiring layer in the groove;

etching the filled wiring layer to thereby form a recess;

depositing a cap film over the semiconductor substrate;

performing a first polishing operation for the cap film deposited on the insulating film for removal at selectivity of R1 (=removal rate for the cap film/removal rate for the insulating film); and performing a second polishing operation for the insulating film after removal of the cap film thereon at selectivity of R2 (=removal rate for the cap film/removal rate for the insulating film), wherein each of the first polishing operation and the second polishing operation is performed by using a slurry having a condition of R1>R2.

2. A method of manufacturing a semiconductor device according to claim 1, wherein a depth of the recess formed by etching the wiring material is larger than the thickness of the cap film.

3. A method of manufacturing a semiconductor device according to claim 2, wherein a main component of the cap film is selected from the group consisting of Ti, Ta, Nb, W, Cr, V, Pt, and Ru, a nitride, an oxide, a boride, and an alloy of any of the elements, and a mixture of the elements.

4. A method of manufacturing a semiconductor device according to claim 2, wherein a main component of the cap film is selected from the group consisting of Si, an Si oxide and an Si nitride, or the cap film is a fluorine-doped oxide film or poly-methyl-siloxane.

5. A method of manufacturing a semiconductor device according to claim 2, wherein a main component of the wiring material is selected from the group consisting of Al, Cu, W, Ru, Ag, Mo, and Si, a nitride, an oxide, a boride and an alloy of any of the elements, and a mixture of any of the elements.

6. A method of manufacturing a semiconductor device according to claim 2, wherein the first polishing operation is performed to leave a step between the cap film in the recess and the insulating film.

7. A method of manufacturing a semiconductor device according to claim 6, wherein the second polishing operation is performed to remove the step between the cap film in the recess and the insulating film.

8. A method of manufacturing a semiconductor device according to claim 1, wherein R1 in the first polishing operation is equal to or larger than 1 and R2 in the second polishing operation is equal to or smaller than 1.

9. A method of manufacturing a semiconductor device according to claim 8, wherein a main component of the cap film is selected from the group consisting of Ti, Ta, Nb, W, Cr, V, Pt, and Ru, a nitride, an oxide, a boride, and an alloy of any of the elements, and a mixture of the elements.

10. A method of manufacturing a semiconductor device according to claim 8, wherein a main component of the cap film is selected from the group consisting of Si, an Si oxide and an Si nitride, or the cap film is a fluorine-doped oxide film or poly-methyl-siloxane.

11. A method of manufacturing a semiconductor device according to claim 8, wherein a main component of the wiring material is selected from the group consisting of Al, Cu, W, Ru, Ag, Mo, and Si, a nitride, an oxide, a boride and an alloy of any of the elements, and a mixture of any of the elements.

12. A method of manufacturing a semiconductor device according to claim 1, wherein a main component of the cap film is selected from the group consisting of Ti, Ta, Nb, W, Cr, V, Pt, and Ru, a nitride, an oxide, a bonde, and an alloy of any of the elements, and a mixture of the elements.

13. A method of manufacturing a semiconductor device according to claim 1, wherein a main component of the cap film is selected from the group consisting of Si, an Si oxide and an Si nitride, or the cap film is a fluorine-doped oxide film.

14. A method of manufacturing a semiconductor device according to claim 1, wherein a main component of the wiring material is selected from the group consisting of Al, Cu, W, Ru, Ag, Mo, and Si, a nitride, an oxide, a boride and an alloy of any of the elements, and a mixture of any of the elements.

* * * * *

UNITED STATES PATENT AND TRADEMARK OFFICE
CERTIFICATE OF CORRECTION

PATENT NO. : 6,897,143 B2
DATED : May 24, 2005
INVENTOR(S) : Toyoda et al.

It is certified that error appears in the above-identified patent and that said Letters Patent is hereby corrected as shown below:

<u>Column 14,</u>
Line 44, change "bonde" to -- boride --.

Signed and Sealed this

Sixteenth Day of August, 2005

JON W. DUDAS
*Director of the United States Patent and Trademark Office*